(12) United States Patent
Krempl et al.

(10) Patent No.: US 6,491,753 B2
(45) Date of Patent: Dec. 10, 2002

(54) METHOD FOR THE GROWING OF SINGLE CRYSTALS

(75) Inventors: Peter Krempl, Kainbach/Graz (AT); Wolfgang Wallnöfer, Graz (AT); Ferdinand Krispel, Wundschuh (AT); Herbert Thanner, Graz (AT)

(73) Assignee: AVL List GmbH, Graz (AT)

( * ) Notice: Subject to any disclaimer, the term of this patent is extended or adjusted under 35 U.S.C. 154(b) by 28 days.

(21) Appl. No.: 09/748,213

(22) Filed: Dec. 27, 2000

(65) Prior Publication Data

US 2001/0007238 A1 Jul. 12, 2001

(30) Foreign Application Priority Data

Dec. 28, 1999 (AT) ................................................ 2195/99

(51) Int. Cl.$^7$ ............................. C30B 29/14; C30B 7/00
(52) U.S. Cl. .............................. 117/68; 117/69; 117/70; 117/71; 117/901; 117/941
(58) Field of Search ............................. 117/68, 69, 70, 117/71, 941, 901

(56) References Cited

U.S. PATENT DOCUMENTS

| 4,559,208 A | * | 12/1985 | Chai et al. .................. 442/209 |
| 5,375,556 A | * | 12/1994 | Krempl et al. ................. 117/71 |

FOREIGN PATENT DOCUMENTS

| AT | 398255 |   | 11/1994 |   |
| EP | 0123809 |   | 11/1984 |   |
| EP | 586366 | * | 8/1993 | ................. 117/71 |
| EP | 0515288 |   | 7/1997 |   |
| JP | 6-191985 | * | 7/1994 | ................. 117/71 |

* cited by examiner

*Primary Examiner*—Robert Kunemund
(74) *Attorney, Agent, or Firm*—Dykema Gossett PLLC

(57) ABSTRACT

To obtain large, high-quality crystals of a metal orthophosphate, in particular $GaPO_4$ or $AlPO_4$, from a nutrient solution with the use of seeds, a seed crystal is used having at least two rod- or wafer-shaped legs which form an angle with each other and define a main growth region, and which are positioned eccentrically in the single crystal grown. Contagious faces of two seed legs, which have been chosen for crystal growing, enclose an angle <180°. In this way the yield of the high-quality crystal region will be increased.

26 Claims, 4 Drawing Sheets

METHOD FOR THE GROWING OF SINGLE CRYSTALS

BACKGROUND OF THE INVENTION

This invention relates to a method for the growing of single crystals of metal orthophosphates of the crystallographic point group 32, especially $GaPO_4$ or $AlPO_4$, from a liquid culture medium using seed crystals with surfaces especially selected for the crystals to be grown.

Such crystals are piezoelectric and have a single optical axis, i.e., they have a preferred crystallographic direction, which is designated z or c or as "optical axis". The crystallographic axes X, Y, Z, and the growth surfaces R, r, m, and z of such crystals are shown in FIG. 1. In a position normal to the wall surfaces m there are three symmetry-equivalent Y-axes (only one shown) and normal to the plane Y and Z there are three X-axes (only one shown). The X-axes are polar, i.e., the + and − directions have different physical properties, such as etching characteristics and velocity of growth. The $GaPO_4$ monocrystal (gallium orthophosphate) has better physical properties than quartz. Particularly to be noted are its piezo effect which is twice as large as in quartz, a higher coupling constant (of interest for surface acoustic wave (SAW) elements) and the absence of an α-β phase transition at 573° C., which permits the material to be used up to 900° C.

For the manufacture of large series of sensors or resonators based on a metal orthophosphate, the use of already existing technology facilities would be desirable. Most lithographic processing plants (for instance for the application of SAW layers) are designed for semiconductor materials, where wafers of 3″ diameter or larger are processed. To make good use of the advantages of the new crystals both, from an economic and technological point of view, large undisturbed crystal regions will thus be required.

The absence of natural seeds has given rise to various growth processes in order to obtain single crystals of as large a size as possible. The problem is that the y faces and m faces and the major rhombohedral faces (R faces) will limit growth (see FIG. 1), which means that only seeds of suitably large Y-dimensions will yield satisfactory results. In the direction of the crystallographic X-axes, however, growth is relatively fast.

Terminology for the directions and faces in metal orthophosphates is summed up in tables 1 and 2. Directions are given in the form of surface normals in brackets (the face being specified by the Bravais-Miller index).

TABLE 1

Terminology for crystal directions in metal orthophosphates of point group 32

| Axis | Direction |
|---|---|
| X ($a_1$) | [2$\bar{1}\bar{1}$0] |
| Y | [01$\bar{1}$0] |
| Z (c) | [0001] |

TABLE 2

Terminology for faces and corresponding Bravais-Miller indices in metal orthophosphates of point group 32

| Name of face | Bravais-Miller Index |
|---|---|
| x | {2$\bar{1}\bar{1}$0} |
| y (m) | {01$\bar{1}$0} |
| z | {0001} |
| r | {01$\bar{1}\bar{1}$} |
| R | {01$\bar{1}$1} |
| 120 | {12$\bar{3}$0} |
| 123 | {12$\bar{3}$3} |

From the growth criteria described above it follows that the optimum choice would be a straight seed 1 whose dimensions should be as large as possible in Y-direction, from where the X wing could develop (see FIG. 2, which also shows the symmetry-equivalent axes Y', Y″ and X', X″). With artificial metal orthophosphates only relatively small dimensions are obtainable when spontaneous crystals are used, even in the case of multiple growth cycles, because the growth rate in Y-direction is extremely low.

DESCRIPTION OF PRIOR ART

The hydrothermal growth process disclosed in AT-B 398 255 will permit use of the longer Y-rods of quartz as seed crystals for producing metal orthophosphates (epitaxy on quartz). In this way considerable dimensions may be achieved in the X- and Y-directions. During the hydrothermal growth process of the epitaxial method problems will occur in the form of growth disturbances. Next to Brazil twinning, the main disturbance will concern the seed quartz itself, which will be a foreign body inside the grown crystal. This situation is shown in FIG. 3, where individual crystal regions are marked out as seen in the direction of the Y-axis. Inclusions, dislocations and cracks due to mechanical stresses are found in the "direct z region" 4. On the other hand, the excellent crystal quality of the "indirect z region" 5 has come as a surprise. The "direct x region" 6 is marked by disturbances in the form of inclusions of the nutrient solution. Depending on conditions of growth, it will be possible nevertheless to use partial regions thereof for applications. The border region between disturbed and undisturbed areas of direct X-growth is formed by the so-called 123 surfaces. These faces are denoted by surface indices {1,2,$\bar{3}$,3}. Starting from this region crystals may be grown without the risk of a disturbed direct x region.

Other known methods have been employed to obtain a larger Y dimension by placing several seed crystals one behind the other in a straight line, as discussed in EP-A 0 123 809, for instance, according to which the faces (z faces) selected for crystal growth are arranged in a plane, the individual wafers having a hexagonal cross-section. EP-B1 0 515 288 presents a method of hydrothermal growth using wafer-shaped seed crystals consisting of crystallization nuclei, which are arranged on a planar base element.

Although it has been attempted to use slowly growing surfaces as seed material, this has only served to confirm the slow growth rates. As a consequence the view has been held until now that the use of straight Y-rods will offer the fast growing x faces maximum space for growing and thus help obtain maximum yield.

SUMMARY OF THE INVENTION

It is an object of this invention to propose a method for growing large, high-quality crystals of metal orthophosphates, while avoiding growth disturbances as far as possible.

In accordance with the invention this object is achieved by using a seed crystal with at least two rod- or wafer-shaped legs forming an angle with each other and defining a main growth region, which are positioned eccentrically in the single crystal grown. It has been found unexpectedly that conventionally slow-growth surfaces will grow much faster if two contiguous crystallographic faces selected for crystal growing form an angle of <180° with each other.

The new process will permit the growing of crystals that are just as large as the ones obtained by using conventional straight seeds, whilst the seed crystal is moved to the edge of the main growth region, thus permitting use of the entire growth zone (e.g., indirect z region). The useful surface area, for example in the X-Y plane, may be doubled in this way, permitting wafers of 3" diameter to be obtained from metal orthophosphate crystals. This is made possible by a new configuration and alignment of the seed crystals.

The invention provides that the seed crystal be obtained from a single crystal as a monolith forming at least two legs, or that it consist of individual rod- or wafer-shaped single crystal elements whose crystallographic axes are aligned so as to be parallel to each other. Best results are obtained by aligning the axes as accurately as possible, although deviations of 2° to 3° will be tolerated.

Different seed geometries can be obtained by cuts from a single crystal piece, or by fitting together ("splicing") individual crystal elements. If a splicing technique is used, a most accurate alignment of the legs of the seed crystal is essential, which must be maintained while the seed cystals are beginning to grow.

Best results will be obtained if the seed crystals can be taken from a single piece of crystal, i.e., monolithically. In that instance any problems concerning mechanical stability or configuration will be avoided and the relative alignment of the legs of the seed crystals is provided automatically. Minor errors of absolute orientation (i.e., small rotations in the angle of the seed crystals) to the extent of a few degrees have virtually no influence on the quality of growth.

It is further provided by the invention that the seed crystal consist of crystal material that is a homeotype of the single crystal to be grown. $GaPO_4$, $AlPO_4$, $FePO_4$, $GaAsO_4$, $AlAsO_4$, $SiO_2$, or $GeO_2$ are the materials preferred in this context. With the use of an epitaxial process a thin layer of the desired crystal material is applied. This process must be performed in two steps, however. The advantage of the epitaxial method is that quartz seeds can be used which are considerably larger and less costly than seed crystals based on metal orthophosphates.

In the instance of a seed crystal with rod-shaped legs it is preferable for the main axes of the legs to define a plane normal to the crystallographic Z-axis.

BRIEF DESCRIPTION OF THE DRAWINGS

The invention is explained in closer detail below by reference to the attached drawings, wherein.

DETAILED DESCRIPTION OF THE PREFERRED EMBODIMENTS

Figure 8:
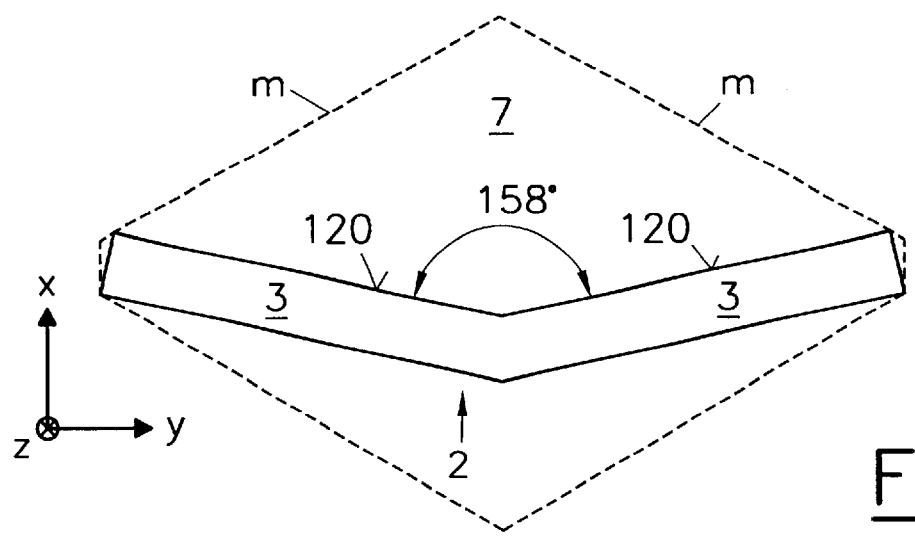
FIG. 8 shows the configuration of two legs of a seed crystal with $\{1\ 2\ \bar{3}\ 0\}$ faces, enclosing an angle of 158°.

As a general rule the faces of the legs of the seed crystal need not be identical with the crystallographic faces. In particular, faces that are tautozonal to the direction of the legs of a seed crystal may be used. Tautozonal faces include all faces whose normal vectors are in one and the same plane. The normal vector of this plane is indicated by the zone symbol just like the crystal directions in Table 1. For example, the family of faces tautozonal to the Y-axis [0 1 $\bar{1}$ 0] includes the x face $\{2\ \bar{1}\ \bar{1}\ 0\}$ and the z face $\{0\ 0\ 0\ 1\}$ as well as any faces $\{2\ \bar{1}\ \bar{1}\ t\}$ lying in between, t signifying any integer. If t approaches infinity the z face will result. In FIG. 8, for example, the $\{1\ 2\ \bar{3}\ 3\}$ face is chosen for growth, whilst the $\{1\ 2\ \bar{3}\ 0\}$ face is used as a seed face for manufacturing reasons (sawing). The seed faces themselves need not be planar, which would not be possible for surfaces that are obtained by sawing, but may show unevenness in the mm range.

Figure 1:
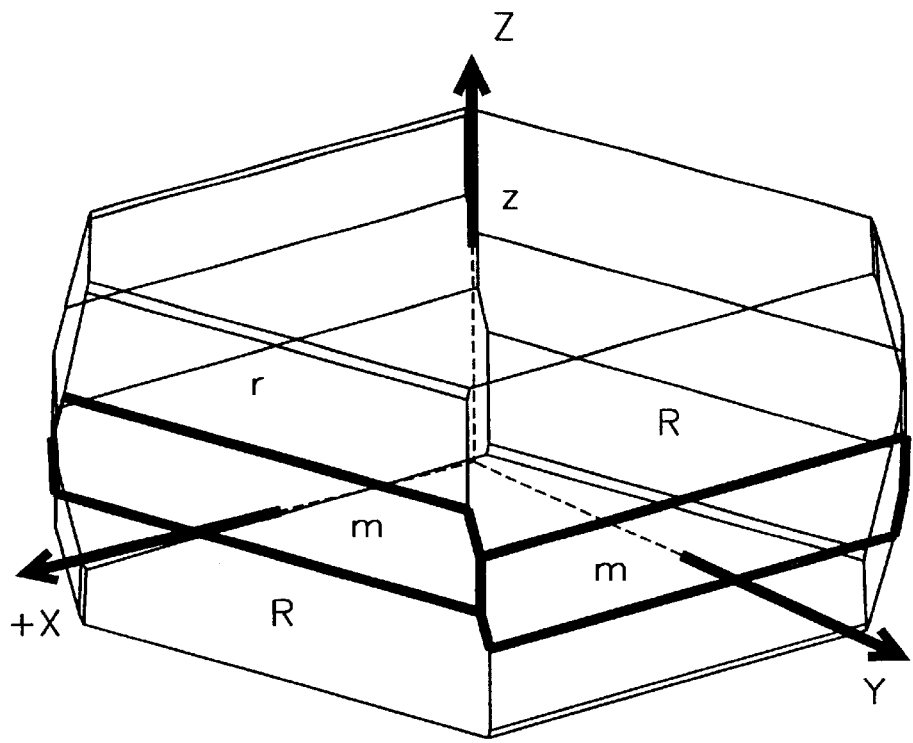
FIG. 1 is a three-dimensional representation of a metal orthophosphate crystal with its crystallographic axes and growth faces.
Figure 2:
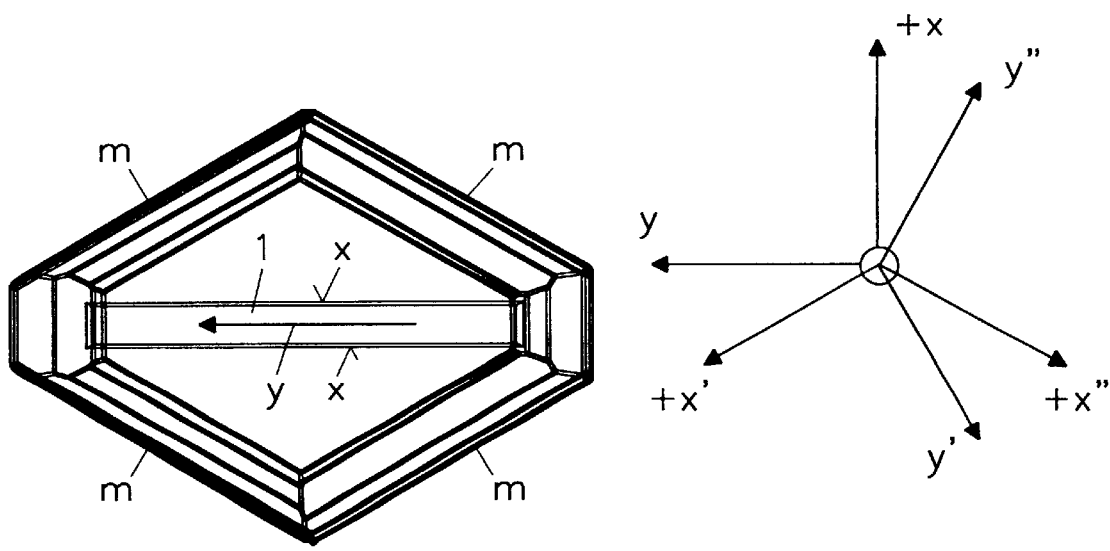
FIG. 2 is a rod-shaped seed crystal whose main axis is in the crystallographic Y-axis, with developing growth faces.
Figure 3:
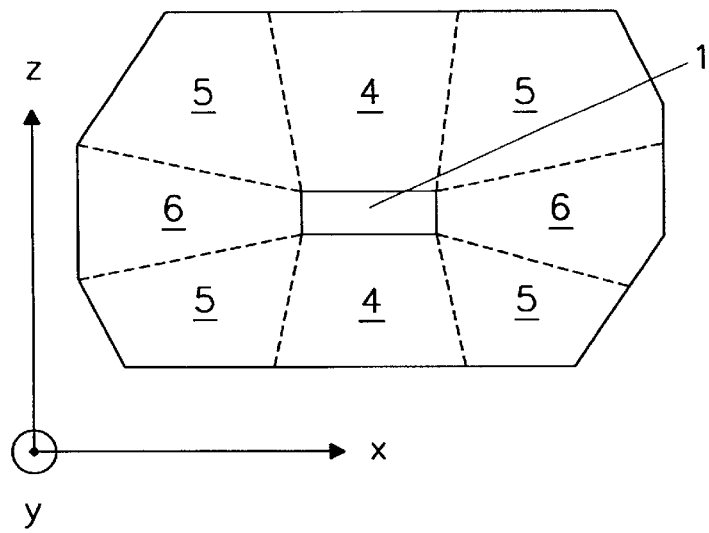
FIG. 3 shows different crystal regions of a metal orthophosphate crystal (in Y-direction)
Figure 4A:
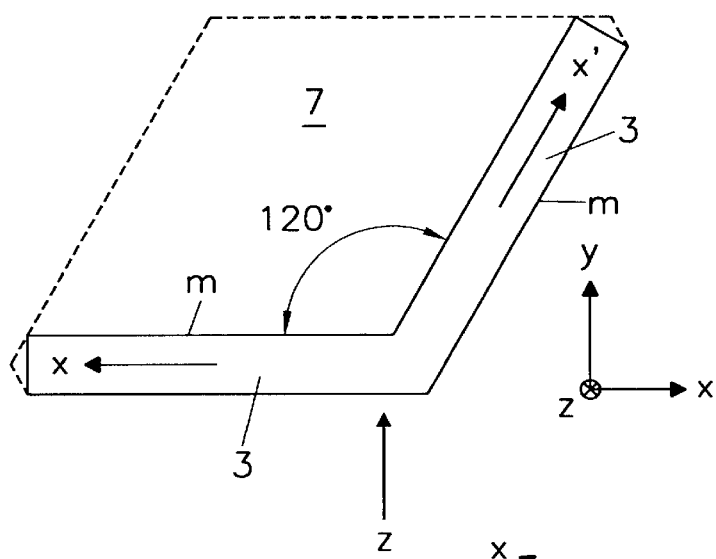
FIG. 4a is a two-dimensional view of the proposed configuration of two legs of a seed crystal (X-rods) at an angle of 120°.
Figure 4B:
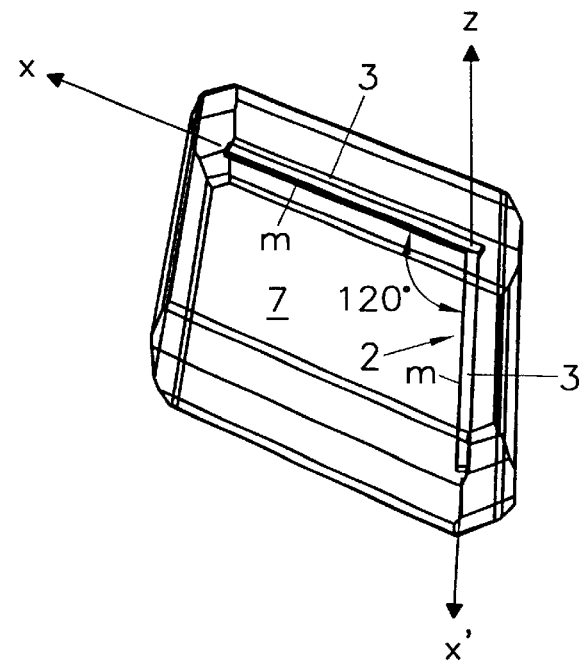
FIG. 4b is a three-dimensional view of this configuration.

The crystallography of metal orthophosphates of point group 32 has already been discussed under FIGS. 1 to 3.

FIGS. 4a to 9 explain the method of the invention by means of the configuration and shape of two or three seed legs in a 90°, 120° or 158° geometry. As regards the rod-shaped legs presented in FIGS. 4a to 8, whose main axis is the crystallographic X-axis (X-rods), or rather the crystallographic Y-axis (Y-rods), they should be placed in the x-y plane where crystal regions of superior quality will be obtained.

As the crystal to be grown is trigonal, i.e., it includes a threefold axis (=Z=optical axis), a rotation about Z by 120° will bring back all the surfaces (see FIG. 1, FIG. 2). The fast growing x faces and the slowly growing y or m faces are normal to each other.

In accordance with the invention the following configurations of the legs 3 of the seed crystal 2 will be possible, the variants referring to the crystallographic faces listed in Table 2 and faces tautozonal thereto:

Contiguous $\{0\ 1\ \bar{1}\ 0\}$ faces (y faces or m faces) of two seed legs form an angle of 120°.

Contiguous $\{2\ \bar{1}\ \bar{1}\ 0\}$ faces (x faces) of two seed legs form an angle of 120°.

Contiguous $\{1\ 2\ \bar{3}\ 0\}$ faces (120-faces) of two seed legs form an angle of 158°.

One $\{2\ \bar{1}\ \bar{1}\ 0\}$ face (x face) of a seed leg forms an angle of 90° with the $\{0\ 1\ \bar{1}\ 0\}$ face (y face) of an adjacent second seed leg.

The $\{2\ \bar{1}\ \bar{1}\ 0\}$ faces (x faces) of three seed legs are arranged so as to form a trough, any two contiguous $\{2\ \bar{1}\ \bar{1}\ 0\}$ faces (x faces) subtending an angle of 120°.

The $\{0\ 1\ \bar{1}\ 0\}$ faces (y faces) of three seed legs are arranged so as to form a trough, any two contiguous $\{0\ 1\ \bar{1}\ 0\}$ faces (y faces) subtending an angle of 120°.

The $\{2\bar{1}\bar{1}0\}$ faces (x faces) of a base leg meet on either side with the $\{01\bar{1}0\}$ face (y face) of a further seed leg at an angle of 90°.

Angular deviations of 2° to 3° will be tolerated.

In accordance with the invention a preferred configuration would be a 120° arrangement of two seed legs 3. The main faces in this case are z and y faces. These legs are referred to a X-rods on account of the chosen longitudinal dimension in the X- or X' direction. Growth preferably takes place on the inside of the seed crystal in the main growth region 7, since it is only in this area that the angle between the growth faces will be smaller than 180°.

In all variants of the invention the growing of the crystal preferably takes place in the main growth region 7 defined by the legs 3 of the seed crystal 2 which are at an angle to each other, resulting in an eccentric position of the seed crystal 2 or its legs 3 in the single crystal grown (FIGS. 4a to 9).

Figure 5:
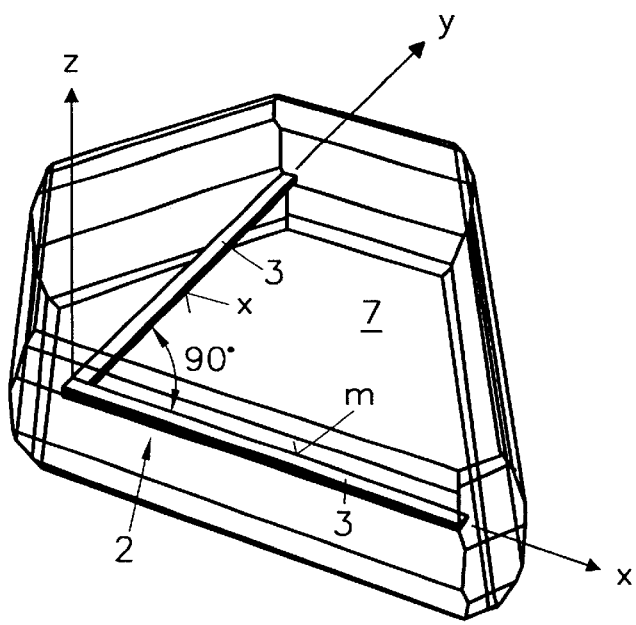
FIG. 5 shows the configuration of an X- and a Y-rod at an angle of 90° in three-dimensional representation.

Another variant of the invention is based on the assumption that the legs of the seed crystal are at a right angle to each other. The fast-growing x face of the base leg (Y-rod) is complemented laterally by one or two X-rods, which are normal to the base leg. (FIG. 5 shows a variant with one X-rod and the Y-rod as a base, FIG. 7 one Y-rod and two X-rods).

Figure 6:
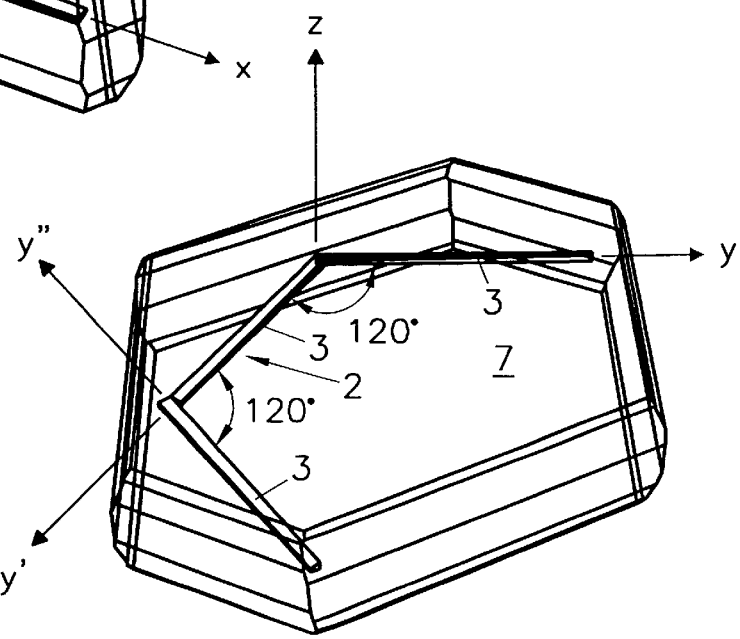
FIG. 6 shows the configuration of three Y-rods at an angle of 120° each.
Figure 7:
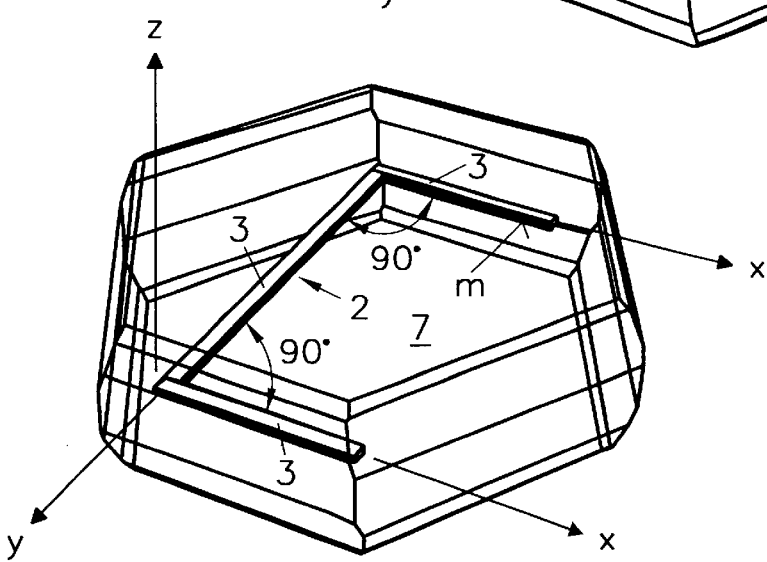
FIG. 7 is a three-dimensional view of the configuration of a Y-rod and two X-rods at an angle of 90° each.

A variant with three legs and 120° angles is shown in FIG. 6. The configuration comprises three Y-rods arranged in the form of a trough. Growth takes place substantially in the interior.

In a further example $\{12\bar{3}0\}$ faces are used as seed legs (FIG. 8). Although the gain in crystal volume will be smaller in this case than with the other embodiments discussed so far, this is expected to be compensated by a reduction of inclusions in the direct x-region.

Figure 9:
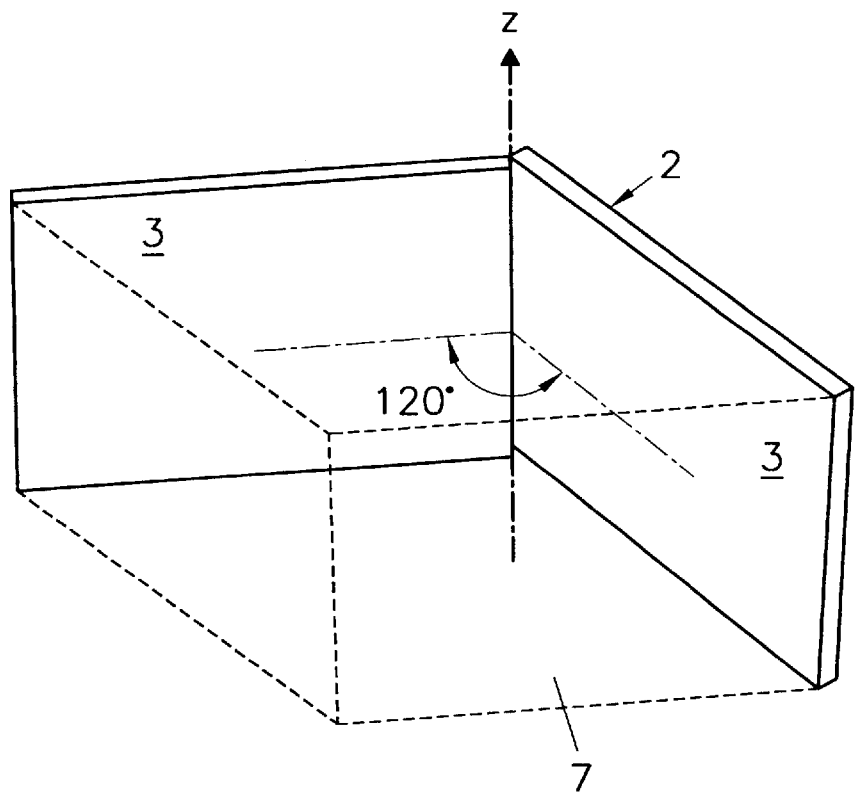
FIG. 9 shows the configuration of two wafer-shaped legs of a seed crystal in a 120° geometry.

FIG. 9 shows a seed crystal 2 comprising two wafer-shaped seed legs 3. The latter may be in a position either normal to Y and Y', respectively, or X and X'; in either instance the seed legs enclose an angle of 120°.

The thickness of the seeds in Z-direction is 2 mm for rod-type seeds, but could also be greater (in the instance of wafer-shaped seed legs).

What is claimed is:

1. A method for growing single crystals of metal orthophosphates belonging to crystallograhpic point group 32 from a liquid culture medium, wherein a seed crystal is used which comprises at least two rod- or wafer-shaped seed legs forming an angle with each other, said seed legs defining a main growth region and being positioned eccentrically in the single crystal grown.

2. A method according to claim 1, wherein said metal orthophosphate is $GaPO_4$.

3. A method according to claim 1, wherein said metal orthophosphate is $AlPO_4$.

4. A method according to claim 1, wherein said seed crystal is obtained from a single crystal as a monolith forming said at least two seed legs.

5. A method according to claim 1, wherein said seed crystal is made of individual rod- or wafer-shaped single crystal elements whose crystallographic axes are aligned so as to be parallel to each other.

6. A method according to claim 1, wherein said seed crystal has rod-shaped legs each defining a main axis and wherein said main axes define a plane normal to the crystallographic Z-axis.

7. A method according to claim 1, wherein a seed crystal material is used being homeotypical relative to said single crystal to be grown.

8. A method according to claim 7, wherein said seed crystal material is one material from a group consisting of $GaPO_4$, $AlPO_4$, $FePO_4$, $GaAsO_4$, $AlAsO_4$, $SiO_2$ and $GeO_2$.

9. A method according to claim 1, wherein three of said seed legs with $\{2\bar{1}\bar{1}0\}$ faces or three of said seed legs with $\{01\bar{1}0\}$ faces are arranged so as to form a trough, such that any two contiguous $\{2\bar{1}\bar{1}0\}$ faces or $\{01\bar{1}0\}$ faces are forming an angle of 120°.

10. A method according to claim 1, wherein said seed legs are aligned such that $\{01\bar{1}0\}$ faces of two seed legs defining said main growth region subtend an angle of 120°.

11. A method according to claim 1, wherein said seed legs are aligned such that $\{2\bar{1}\bar{1}0\}$ faces of two seed legs defining said main growth region subtend an angle of 120°.

12. A method according to claim 1, wherein a $\{2\bar{1}\bar{1}0\}$ face of one of said seed legs together with a $\{01\bar{1}0\}$ face of an adjacent second of said seed legs are defining a main growth area and said faces subtending an angle of 90°.

13. A method according to claim 1, wherein three of said seed legs are used, a $\{2\bar{1}\bar{1}0\}$ face of a base seed leg being met on either side by a $\{01\bar{1}0\}$ face of a further of said seed legs at an angle of 90°.

14. A method according to claim 1, wherein said seed legs are aligned such that $\{12\bar{3}0\}$ faces of two of said seed legs defining a main growth region subtend an angle of 158°.

15. A method for growing single crystals of metal orthophosphates belonging to crystallographic point group 32 from a liquid culture medium, wherein a seed crystal is used which comprises at least tow rod- or wafer-shaped seed legs forming an angle with each other, said seed legs defining a main growth region and being positioned eccentrically in the single crystal grown, wherein said seed crystal is made of individual rod- or wafer-shaped single crystal elements whose crystallographic axes are aligned so as to be parallel to each other.

16. A method according to claim 15, wherein said metal orthophosphate is $GaPO_4$.

17. A method according to claim 15, wherein said metal orthophosphate is $AlPO_4$.

18. A method according to claim 15, wherein said seed crystal has rod-shaped legs each defining a main axis and wherein said main axis define a plane normal to the crystallographic Z-axis.

19. A method according to claim 15, wherein a seed crystal material is used being homeotypical relative to said single crystal to be grown.

20. A method according to claim 15, wherein said seed crystal material is one material from a group consisting of $GaPO_4$, $AlPO_4$, $FePO_4$, $GaAsO_4$, $AlAsO_4$, $SiO_2$ and $GeO_2$.

21. A method for growing single crystals of metal orthophosphates belonging to crystallographic point group 32 from a liquid culture medium, wherein a seed crystal is used which comprises at least three rod- or wafer-shaped seed legs forming an angle with each other, said seed legs defining a main growth region and being positioned eccentrically in the single crystal grown, wherein three of said seed legs with $\{2\bar{1}\bar{1}0\}$ faces or three of said seed legs with $\{01\bar{1}0\}$ faces are arranged so as to form a trough, such that any two contiguous $\{2\bar{1}\bar{1}0\}$ faces or $\{01\bar{1}0\}$ faces are forming an angle of 120°.

22. A method for growing single crystals of metal orthophosphates belonging to crystallographic point group 32 from a liquid culture medium, wherein a seed crystal is used which comprises at least two rod- or wafer-shaped seed legs forming an angle with each other, said seed legs defining a main growth region and being positioned eccentrically in the single crystal grown, wherein said seed legs are aligned such that $\{0\ 1\ \bar{1}\ 0\}$ faces of two seed legs defining said main growth region subtend an angle of 120°.

23. A method for growing single crystals of metal orthophosphates belonging to crystallographic point group 32 from a liquid culture medium, wherein a seed crystal is used which comprises at least two rod- or wafer-shaped seed legs forming an angle with each other, said seed legs defining a main growth region and being positioned eccentrically in the single crystal grown, wherein said seed legs are aligned such that $\{2\ \bar{1}\ \bar{1}\ 0\}$ faces of two seed legs defining said main growth region subtend an angle of 120°.

24. A method for growing single crystals of metal orthophosphates belonging to crystallographic point group 32 from a liquid culture medium, wherein a seed crystal is used which comprises at least two rod- or wafer-shaped seed legs forming an angle with each other, said seed legs defining a main growth region and being positioned eccentrically in the single crystal grown, wherein a $\{2\ \bar{1}\ \bar{1}\ 0\}$ face of one of said seed legs together with a $\{0\ 1\ \bar{1}\ 0\}$ face of an adjacent second of said seed legs are defining a main growth area and said faces subtending an angle of 90°.

25. A method for growing single crystals of metal orthophosphates belonging to crystallographic point group 32 from a liquid culture medium, wherein a seed crystal is used which comprises at least two rod- or wafer-shaped seed legs forming an angle with each other, said seed legs defining a main growth region and being positioned eccentrically in the single crystal grown, wherein three of said seed legs are used, a $\{2\ \bar{1}\ \bar{1}\ 0\}$ face of a base seed leg being met on either side by a $\{0\ 1\ \bar{1}\ 0\}$ face of a further of said seed legs at an angle of 90°.

26. A method for growing single crystals of metal orthophosphates belonging to crystallographic point group 32 from a liquid culture medium, wherein a seed crystal is used which comprises at least two rod- or wafer-shaped seed legs forming an angle with each other, said seed legs defining a main growth region and being positioned eccentrically in the single crystal grown, wherein said seed legs are aligned such that $\{1\ 2\ \bar{3}\ 0\}$ faces of two of said seed legs defining a main growth region subtend an angle of 158°.

\* \* \* \* \*